Jan. 7, 1969 A. L. KELLER 3,421,107

MULTIVIBRATOR FLASHER CIRCUIT HAVING ADVANCED TURN-ON

Filed Aug. 1, 1966

INVENTOR
ADAM L. KELLER
BY Smythe & Moore
ATTORNEYS

United States Patent Office 3,421,107

Patented Jan. 7, 1969

3,421,107

MULTIVIBRATOR FLASHER CIRCUIT HAVING ADVANCED TURN-ON

Adam L. Keller, Michigan City, Ind., assignor to Swiss Controls & Research, Inc., Michigan City, Ind., a corporation of Illinois Filed Aug. 1, 1966, Ser. No. 569,504

U.S. Cl. 331—113 8 Claims

Int. Cl. H03k 3/28

ABSTRACT OF THE DISCLOSURE

A multivibrator flasher circuit for automotive or like use wherein a load or power switching transistor is reverse biased during a substantial portion of the non-conductive "off" periods to minimize leakage therethrough and is rendered conductive (turned-on) during the latter portion of its normal "off" periods further to prevent destructive leakage currents.

This invention relates to a multivibrator switching circuit for flashers or the like and more particularly to a transistorized circuit adapted for automotive or like use in which a D.C. source of relatively high voltage is employed.

In copending application Ser. No. 569,505, filed Aug. 1, 1966, and assigned to the same assignee as the present invention, there is shown a multivibrator switching circuit for flashers or the like in which a germanium transistor is utilized for the load or power switching transistor and a means for providing a reverse bias voltage between the base and emitter of the power switching transistor during periods of nonconduction or "off" time is provided substantially to avoid or minimize high leakage current through the transistor during at least a substantial portion of such periods. While the circuit arrangement including a protective diode as therein shown and described is satisfactory for certain applications, it does not provide the necessary reverse bias on the base to emitter junction of the power transistor near the end (approximately last 20%) of the "off" time of the transistor and therefore leakage currents may become quite high during this last portion of the "off" time, particularly at the elevated temperatures of a higher voltage source and greater load.

A principal object of the present invention, therefore, is to provide an improved transistorized switching circuit for flashers or the like in which a germanium transistor is utilized for the load or power switching transistor.

More specifically, it is an object of the present invention to provide a germanium controlled power switching circuit for flashers or the like in which high leakage currents through the germanium power transistor are substantially entirely avoided.

A further object is to provide a germanium controlled power switching circuit in which the germanium power transistor is turned "on" (rendered conductive) at a predetermined point in the "off" or nonconductive cycle to avoid high leakage currents during the end portion of the normal "off" period.

A further object is to provide a multivibrator switching circuit for flashers or the like in which a germanium transistor is utilized for the load or power switching transistor and the germanium power transistor is turned "on" prior to the end of the "off" cycle as normally determined by the multivibrator circuit to avoid high leakage currents during the end portion of the normal "off" period.

In one aspect of the invention, a common form of free-running transistor multivibrator operates a cascaded germanium power switching transistor periodically to turn a flashing lamp or other load circuit on and off. To avoid or minimize high leakage currents through the germanium power transistor during a substantial portion of the "off" period or time, a diode is connected across the base to emitter junction of the multivibrator transistor associated with the power transistor and is so connected as to be forward biased when the multivibrator transistor is nonconductive, thereby to reverse bias the base-to-emitter junction of the power transistor during such substantial portion of the "off" period as shown and described in the aforesaid copending application Ser. No. 569,505. This protective feedback or reverse bias voltage is applied to the power transistor for only such time as the diode is forward biased, however, and with the circuit shown in the copending application, the diode is not forward biased during the last portion (approximately 20%) of the "off" period, thereby permitting high leakage currents through the germanium power transistor during such portion as above described. Substantially to avoid such high leakage currents at the end portion of the "off" cycle or time as normally determined by the multivibrator, the present invention provides a means or "turn-on" circuit for turning the power back on prior to the last 20% of the "off" time, i.e., at or prior to the time that the protective diode loses its forward bias. In the illustrated aspect, this circuit or means comprises a relaxation oscillator operating at about one hundred times the natural frequency of the switching multivibrator, an inverter and clipper, and a capacitor for feeding the clipped pulses to the base of the multivibrator transistor connected to the power transistor to provide a "turn-on" pulse at a proper point of time in the "off" period or cycle.

Other objects, advantages and features of the invention will become apparent from the following description and drawings which are merely exemplary.

Figures 1, 2, 3:
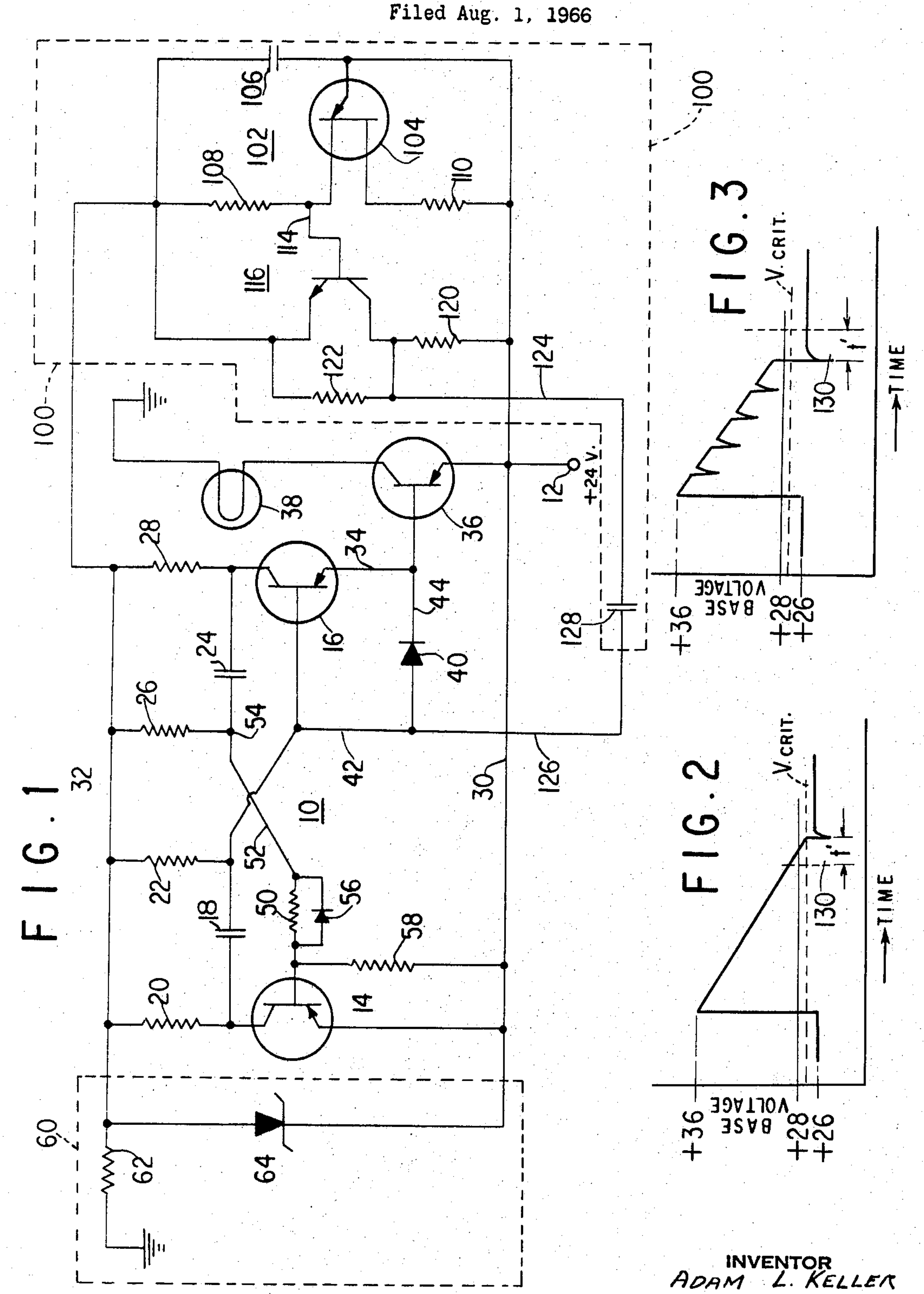
FIG. 1 is a wiring diagram of a multivibrator switching circuit and an associated "turn-on" circuit arranged in accordance with the present invention.
FIG. 2 is a pictorial or graphic view of the voltage waveform which would normally be applied to the base of the multivibrator transistor connected to the power transistor during the "off" period of the transistors.
FIG. 3 is a similar view illustrating the waveform with the "turn-on" pulses of the present invention added.

Referring to the drawings, and more particularly to FIG. 1, there is shown a multivibrator 10 which is illustrated as comprising one form of a free-running multivibrator having a pair of PNP transistors 14 and 16. The emitter of transistor 16 is connected by conductor 34 to the base of a power or load switching transistor 36 having the power circuit for a lamp or like load 38 connected through its emitter-collector circuit. The emitters of transistors 16 and 36 are thus connected in cascade, and the power switching transistor 36 turns on and off as the multivibrator transistor 16 turns on and off in a manner known in the art. To provide an efficient power switching transistor having long life at relatively high loads, the transistor 36 preferably comprises a germanium transistor. Such transistors, however, have a high leakage current, particularly at elevated temperatures, during the "off" or nonconducting period of the transistor unless a reverse bias voltage is applied to its base to emitter junction during such periods. To provide such reverse bias, a diode 40 is connected in the manner above set forth across the base to emitter junction of transistor 16. To eliminate or reduce undesirable ripples and peaks in the source voltage applied to the multivibrator circuit, a voltage regulator indicated generally by the dashed box 60 may be connected across the bus conductors 30 and 32 as shown at the left side of FIG. 1. Bus 30 is connected at 12 to one side of a D.C. source of power, here indicated as +24 volts, and bus 32 is connected through ground to the other side of the source. The buses furnish power to the several parts of the circuit.

Except for the higher indicated source voltage of 24 volts, the circuit thus far described and its manner of operation are the same or similar to that shown and described in the aforesaid copending application Ser. No. 569,505, and the same reference numerals have been used for like parts in the two applications. As above set forth, however, this circuit does not provide the desired reverse voltage bias between the base and emitter of the germanium power transistor 36 during the last portion (approximately 20%) of the time that the transistors 16 and 36 are normally "off" or nonconducting since the diode 40 loses its forward bias and fails to conduct during this portion of the "off" period. During such time, therefore, the leakage current through the power transistor 36 may rise to a high value, particularly at the elevated temperatures of a higher voltage source such as a 24-volt D.C. battery. To avoid or substantially eliminate this high leakage current during the last portion of the "off" period or time, the present invention provides a "turn-on" circuit which causes the transistor 16, and thus the transistor 36, to turn back on at or prior to the time in the normal "off" period that the diode 40 loses its forward bias.

Referring again to FIG. 1, and more particularly to the portion of the circuit shown in the dashed lines 100 at the right of the figure, the "turn-on" circuit is shown as comprising a typical unijunction relaxation oscillator 102 consisting of a unijunction transistor 104, a capacitor 106 and resistors 108, 110 and 112, and having an RC time constant such that the oscillator operates at about one hundred times the natural frequency of the multivibrator 10. The output pulses of the oscillator 102 are fed by conductor 114 to an inverter and clipper 116 comprising an NPN transistor 118 and resistors 120 and 122. Both the oscillator 102 and the inverter and clipper 116 are connected across the bus lines 30 and 32 and operate in a manner well known in the art. The inverted and clipped pulses are fed through conductors 124 and 126 and a capacitor 128 to the base of transistor 16.

The operation of the "turn-on" circuit is as follows. Referring to FIG. 2, there is shown a pictorial representation of the voltage waveform normally applied to the base of transistor 16 by the multivibrator 10 during the "off" or nonconducting period of the transistor. When the downslope voltage crosses the dashed line $V_{crit}$, the power transistor 36 turns on. This time is normally controlled by the RC time constant of resistor 22 and capacitor 18 of FIG. 1. The dashed line 130 in FIG. 2 represents the point in the "off" period where the voltage on the base of transistor 16 drops to such value that the diode 40 (FIG. 1) loses its forward bias, and the time $t_1$ (FIG. 2) therefore represents the time (approximately 20%) of high leakage through the power transistor 36.

Referring now to FIG. 3, there is shown the same voltage waveform on the base of transistor 16 as in FIG. 2 except that the pulses 132 from the "turn-on" circuit 100 have now been added. At the point or time 130 of FIGS. 2 and 3, a "turn-on" pulse crosses the $V_{crit}$ line and power transistor 36 is turned on through transistor 16, thus eliminating the time $t_1$ of FIGS. 2 and 3. This permits operation of the flasher circuit at much higher temperatures and with less leakage current than in the circuit of the copending application Serial No. 569,505.

While an exemplary embodiment of the invention has been shown and described, it will be apparent that changes can be made in various details without departing from the spirit of the invention, except as defined in the appended claims.

What is claimed is:

1. In a transistorized switching circuit for flashers, the combination of a power switching transistor, means for connecting a load through said power switching transistor, and means for minimizing high leakage currents through said power switching transistor during non-conductive periods thereof, said means including a second transistor having its emitter connected to the base of said power transistor for periodically turning the power switching transistor on and off, and a "turn-on" means connected to the base of said second transistor, said "turn-on" means providing for turning the power transistor on prior to the end of the normal "off" period as determined by said periodic means.

2. A combination as set forth in claim 1 in which said "turn-on" means includes a relaxation oscillator and an inverter and clipper means.

3. A combination as set forth in claim 1 in which said periodic means comprises a multivibrator.

4. A combination as set forth in claim 1 in which said power switching transistor comprises a germanium transistor, a diode means is so connected across the base-to-emitter junction of said second transistor as to be forward biased when said second transistor is nonconducting, thereby to provide a reverse bias voltage across the base-to-emitter junction of said power transistor during a substantial portion of the normal "off" period of said second transistor, and said "turn-on" means operates to turn said power transistor on at approximately a point in the normal "off" time where said diode means loses its forward bias to become nonconducting.

5. A combination as set forth in claim 4 in which said "turn-on" means becomes operative at a point in time approximately 20% prior to the end of the normal "off" time.

6. A combination as set forth in claim 4 in which said second transistor comprises part of a free-running multivibrator, and said "turn-on" means includes an oscillator operating at a frequency greater than the natural frequency of said multivibrator.

7. A combination as set forth in claim 1 in which said periodic means comprises a free-running multivibrator and said "turn-on" means includes an oscillator operating at a frequency greater than the natural frequency of said multivibrator.

8. A combination as set forth in claim 7 in which said oscillator comprises a relaxation oscillator operating at approximately one hundred times the natural frequency of said multivibrator.

References Cited

UNITED STATES PATENTS

| | | | |
|---|---|---|---|
| 3,005,963 | 10/1961 | Emile | 331—11 |
| 3,183,368 | 5/1965 | Ross | 331—11 |
| 3,240,989 | 3/1966 | Grunwaldt | 331—11 |
| 3,259,852 | 7/1966 | Todd | 331—11 |

OTHER REFERENCES

R. A. Stasior, application note 90.2, "Transistorized Flashers," 4 pages, April 1962, 331—113.

JOHN KOMINSKI, *Primary Examiner.*

U.S. Cl. X.R.

331—52, 111; 315—100, 200, 77; 307—296